United States Patent
Liao et al.

(10) Patent No.: US 6,794,061 B2
(45) Date of Patent: Sep. 21, 2004

(54) ORGANIC ELECTROLUMINESCENT DEVICE HAVING AN ADHESION-PROMOTING LAYER FOR USE WITH A MAGNESIUM CATHODE

(75) Inventors: Liang-Sheng L. Liao, Rochester, NY (US); Joseph K. Madathil, Rochester, NY (US); Pranab K. Raychaudhuri, Rochester, NY (US); Ching W. Tang, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/062,361

(22) Filed: Jan. 31, 2002

(65) Prior Publication Data

US 2003/0152801 A1 Aug. 14, 2003

(51) Int. Cl.⁷ .............................................. H05B 33/12
(52) U.S. Cl. ....................... 428/690; 428/917; 313/504; 313/506
(58) Field of Search ................................ 428/690, 917, 428/332, 457; 313/504, 506, 509; 427/66

(56) References Cited

U.S. PATENT DOCUMENTS

| | | | | |
|---|---|---|---|---|
| 4,885,211 A | | 12/1989 | Tang et al. ................. | 428/457 |
| 5,059,862 A | | 10/1991 | VanSlyke et al. ........... | 313/503 |
| 5,457,565 A | | 10/1995 | Namiki et al. .............. | 359/273 |
| 5,516,577 A | * | 5/1996 | Matsuura et al. ........... | 428/212 |
| 5,739,635 A | | 4/1998 | Wakimoto ................... | 313/504 |
| 5,776,622 A | * | 7/1998 | Hung et al. ................. | 428/690 |
| 5,776,623 A | | 7/1998 | Hung et al. ................. | 428/690 |
| 6,013,384 A | | 1/2000 | Kido et al. .................. | 428/690 |
| 6,248,458 B1 | | 6/2001 | Yoon et al. ................. | 428/690 |
| 6,509,109 B1 | * | 1/2003 | Nakamura et al. .......... | 428/690 |

FOREIGN PATENT DOCUMENTS

| | | | |
|---|---|---|---|
| EP | 0 740 489 | | 10/1996 |
| EP | 0 936 844 A2 | | 8/1999 |
| EP | 1 076 368 | | 2/2001 |
| GB | 2 348 316 | | 9/2000 |
| JP | 06-325871 | * | 5/1993 |
| JP | 2000-091072 | * | 3/2000 |

OTHER PUBLICATIONS

"Bright Organic Electroluminescent Devices with Double-Layer Cathode", by Junji Kido et al., IEEE Transactions on Electron Devices, vol. 40, No. 7, Jul. 1993.

* cited by examiner

Primary Examiner—Dawn L. Garrett
(74) Attorney, Agent, or Firm—Raymond L. Owens (57) ABSTRACT

An organic electroluminescent device is provided that includes an anode and a substantially pure Mg cathode, an electroluminescent medium disposed between the anode and the cathode, and an adhesion-promoting layer in contact with cathode and the electroluminescent medium. The adhesion-promoting layer comprises at least one metal or metal compound selected from group 1 through group 15 of the Periodic Table of Elements such that the metal has an atomic number of at least 19.

12 Claims, 5 Drawing Sheets

ORGANIC ELECTROLUMINESCENT DEVICE HAVING AN ADHESION-PROMOTING LAYER FOR USE WITH A MAGNESIUM CATHODE

FIELD OF THE INVENTION

The present invention relates to organic electroluminescent devices. More particularly, it relates to using new cathode materials.

BACKGROUND OF THE INVENTION

Organic electroluminescent (EL) devices or organic light-emitting diodes (OLEDs) are electronic devices that emit light in response to an applied potential. The structure of an OLED comprises, in sequence, an anode, an organic EL medium, and a cathode. The organic EL medium disposed between the anode and the cathode is commonly comprised of an organic hole-transporting layer (HTL) and an organic electron-transporting layer (ETL). Holes and electrons recombine and emit light in the ETL near the interface at the HTL. Tang et al. (Applied Physics Letters, 51, 913 [1987], Journal of Applied Physics, 65, 3610 [1989], and commonly assigned U.S. Pat. No. 4,769,292) demonstrated highly efficient OLEDs using such a layer structure. Since then, numerous OLEDs with alternative layer structures have been disclosed.

The cathode plays an important role in the overall performance of OLED devices. It injects electrons into the ETL during operation. However, there is often an adhesion problem between the metal cathode and the organic ETL in OLEDs. This rough interface between cathode and organic layer due to poor adhesion results in poor device performance, such as higher driving voltage, lower luminescent efficiency, and shorter operational lifetime.

The addressed adhesion problem between the metal cathode and the organic layer has been discussed in Tang and VanSlyke (U.S. Pat. No. 4,885,211). It was found that Mg does not adhere well to organic surface during thermal evaporation, which results in a high sheet resistance, rough film morphology, and poor device performance of Mg cathode devices. Tang and VanSlyke therefore disclosed magnesium alloy electrodes such as Mg:Ag (U.S. Pat. No. 4,885,211) and an Al:Mg (U.S. Pat. No. 5,059,862). The alloy cathodes have improved adhesion to ETL and are formed by co-evaporation of Mg with Ag or Al. With such Mg alloy cathodes, OLEDs can achieve better performance than devices having pure Mg as a cathode. However, fabrication of a Mg alloy cathode requires two thermal evaporation sources that must be precisely controlled to ensure the proper alloy ratio. The dual source evaporation is necessarily more complicated than single source evaporation. As for Al:Mg cathode, thermal evaporation of Al with suitable evaporation rate is difficult to achieve.

There have been numerous disclosures of using alkali metal compounds (U.S. Pat. No. 5,739,635), alkaline earth metal compounds (U.S. Pat. No. 5,457,565), and other materials (U.S. Pat. No. 6,013,384) as an electron-injecting layer (EIL) for use with Al cathodes. Lithium compounds in particular have been widely disclosed as a useful EIL material for Al cathodes. However, substantially pure Mg has several desirable features including a low-work function (~3.7 eV) and excellent thermal evaporation properties. The use of substantially pure Mg as a cathode in high efficiency OLEDs has not been demonstrated.

SUMMARY OF THE INVENTION

It is an object of the present invention to provide an OLED with good adhesion between a substantially pure magnesium cathode and organic layer.

It is another object of the present invention to provide OLED with an evaporated magnesium cathode.

It is another object of the present invention to improve the efficiency, driving voltage, and operational stability of OLED.

These objects are achieved in an organic electroluminescent device comprising:

a) an anode and a cathode;

b) an electroluminescent medium disposed between the anode and the cathode;

c) an adhesion-promoting layer in contact with the cathode and the electroluminescent medium;

d) the adhesion-promoting layer has a thickness of between 0.01 to 3.0 nm and comprises at least one metal or metal compound selected from group 1 through group 15 of the Periodic Table of Elements such that the metal has an atomic number of at least 19; and e) the cathode is substantially pure magnesium.

ADVANTAGES

An advantage of the present invention is that a substantially pure Mg cathode can be made useful in high efficiency OLEDs. It has been found quite unexpectedly that the adhesion-promoting layer, in the thickness range from 0.01 nm to 3.0 nm, can significantly improve the adhesion of Mg on the organic EL medium.

Another advantage of the present invention is that the EL efficiency, driving voltage, and operational stability of the OLEDs can also be improved by disposing the adhesion-promoting layer between ETL and the substantially pure Mg cathode.

BRIEF DESCRIPTION OF THE DRAWINGS

It will be understood that FIG. 1 and FIG. 2 are not to scale since the individual layers are too thin and the thickness differences of various elements are too great to permit depiction to scale.

DETAILED DESCRIPTION OF THE INVENTION

In order to more fully appreciate the construction and the performance of the OLED with an adhesion-promoting layer disposed between an electron-transporting layer and the cathode in the present invention, an OLED without the adhesion-promoting layer will be described with reference to FIG. 1. While FIG. 1 serves as an example, there are numerous OLEDs known in the art with alternative layer structures. The present invention is applicable to any OLED containing an organic EL medium/cathode interface.

Figure 1:
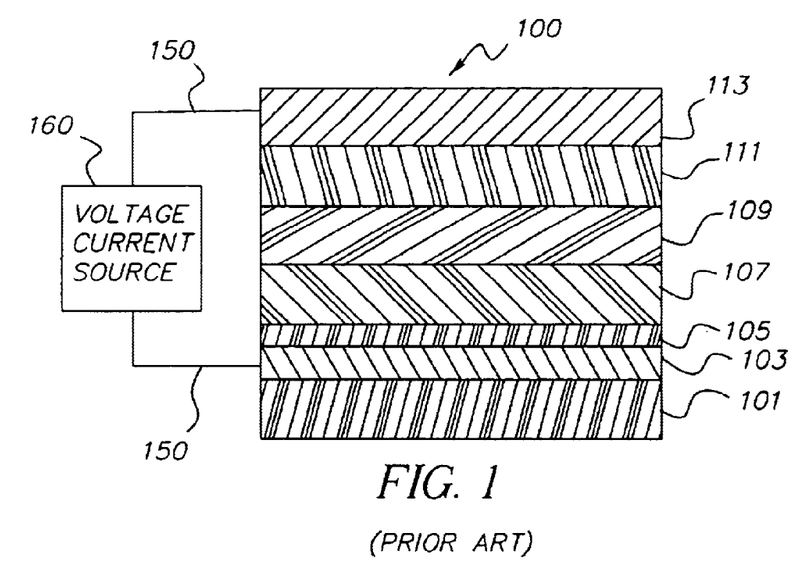
FIG. 1 depicts a schematic cross sectional view of a prior art OLED.

A typical prior art OLED structure is shown in FIG. 1 as OLED 100. OLED 100 is comprised of a substrate 101, an anode layer 103, an optional hole-injecting layer (HIL) 105, a hole-transporting layer 107, a light-emitting layer (LEL) 109, an electron-transporting layer 111, and a cathode layer 113. These layers are described in detail below.

OLED 100 is operated by applying an electric potential, generated by voltage/current source 160, between anode 103 and the cathode 113, such that anode 103 is at a more positive potential with respect to the cathode 113. Electrical conductors 150 connect anode 103 and cathode 113 to voltage/current source 160. By applying an electric potential, holes (positively charged carriers) are injected from anode 103 through HIL 105 into HTL 107. Simultaneously, electrons (negatively charged carriers) are injected from cathode 113 into ETL 111. The holes and electrons recombine in LEL 109. This hole-electron recombination results in light emission from LEL 109.

Figure 2:
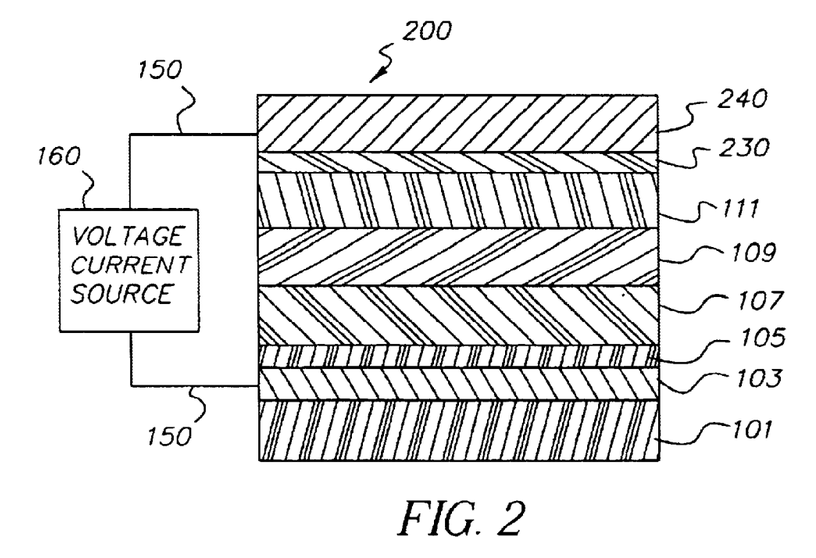
FIG. 2 is a schematic cross sectional view of an OLED in accordance with the present invention, and having an adhesion-promoting layer disposed between the ETL and the cathode.

Turning to FIG. 2, OLED 200 of the present invention has an adhesion-promoting layer 230 situated between ETL 111 and cathode 240. OLED 200 is otherwise constructed and operated in a fashion similar to prior art OLED 100. Cathode 240 is comprised of substantially pure Mg. Substantially pure means that the purity of the Mg cathode is greater than 90% Mg by volume, preferably greater than 99% Mg, and ideally greater than 99.9% Mg. The advantages of the present invention are most apparent when substantially pure magnesium is used as the cathode.

As mentioned previously, usually there is an adhesion problem between a Mg cathode and an organic layer in OLEDs. As disclosed by Tang et al. (U.S. Pat. No. 4,885,211), the reason why pure Mg cannot be thermally evaporated on organic surface to form a good contact is that Mg does not adhere well to the organic surface. FIG. 4 in U.S. Pat. No. 4,885,211 shows rough surface morphology of a Mg cathode as compared to that of a Mg:Ag cathode. The organic surface does not provide enough nucleation sites for metal atoms to form a metal film with good adhesion. Therefore, it is believed that during the deposition of Mg on the surface of organic layer (for example, on the surface of tris(8-hydroxyquinoline)aluminum(III) layer), Mg atoms first form nuclei at some nucleation sites on the surface. Because of the shortage of nucleation sites on the surface, the subsequent deposition of Mg atoms leads to the growth of these nuclei into separated microcrystals resulting an uneven and random distribution of microcrystals and forming a nonuniform cathode eventually.

However, the number of nucleation sites on the organic surface can be intentionally increased by some surface modification methods. In the present invention, a thin layer is deposited (by thin is meant that the layer thickness is less than 3 nm) of metal or metal compound, which preferably has different crystal structure from Mg, on the organic surface before the deposition of substantially pure Mg cathode. During the deposition, the metallic atoms or molecules of the metal compound may react with organic molecules to form nucleation sites that enable the Mg atoms to adhere to the modified surface during the subsequent deposition of Mg layer. Although reaction of the metallic atoms or compounds with the organic surface is desirable for adhesion, metals or metallic compounds that simply form nuclei on the organic layer surface may also improve the sticking of Mg during the subsequent Mg deposition. The thin layer of metal or metal compound is layer 230 in FIG. 2. Upon the deposition of layer 230 and in the subsequent deposition of Mg cathode layer 240, Mg atoms form nuclei at the nucleation sites on the organic surface. Because these nucleation sites can have various crystal structures different from the pure Mg, the spatial symmetry of Mg crystal structure at these sites is reduced and therefore the crystalline growth of Mg is retarded, rendering the Mg layer more continuous. Moreover, because there are enough nucleation sites on the organic surface after the deposition of layer 230, the separated Mg microcrystals could be more easily connected together and could form a continuous film at an earlier stage. Therefore, a very good contact between ETL 111 and Mg cathode 240 is achieved.

Preferred materials for the adhesion-promoting layer should have: a) different crystal structure than that of Mg; b) low-work function (<3.7 eV) if better electron injection than Mg cathode is required; and c) a low diffusion rate into the organic film. As is known, Mg has a hexagonal crystal structure. In order to more effectively reduce the spatial symmetry of Mg and retard the microcrystal growth of Mg in the early stage of nucleation, the material used for the adhesion-promoting layer preferably, but not limited to, has other kinds of crystal structures, such as cubic, face centered cubic, body centered cubic, rhombohedral, tetragonal, and orthorhombic. Low diffusion rates are offered by metals or metal compounds wherein the metal has an atomic number of at least 19. More specifically, useful materials that may be utilized in the layer 230 include metals or metal compound selected from group 1 through group 15 of the Periodic Table of Elements such that the metal has an atomic number of at least 19. Such materials include alkali metals with atomic weights greater than that of Na, alkaline earth metals with atomic weights greater than that of Mg, alkaline rare earth metals, and transition metals. These metals may also be applied as metal compounds in higher oxidation states. Of particular use are the simple metal salts, metal oxides, and metal halides. Examples of anions that form simple metal salts include nitrate, nitrite, sulfate, sulfite, sulfide, silicate, carbonate, borate, perchlorate, phosphate, phosphite, acetate, and other carboxylates.

Particularly useful metals for use in layer 230 include: Sb, Ge, Sn, Pb, Ga, Zn, Ni, Pd, Pt, Rh, Ir, Fe, Mn, Nb, La, Ce, Sm, Eu, Tb, Dy, Yb, Ca, Sr, Ba, K, Rb, or Cs, and their compounds including simple salts, oxides, and halides. When it is desired that the adhesion-promoting layer 230 also have a low-work function property, alkali metals, alkaline earth metals, and rare earth metals, including K, Rb, Cs, Ca, Sr, Ba, La, Ce, Sm, Eu, Tb, Dy, or Yb, and their compounds as defined previously, are particularly useful. Note that we have surprisingly found that common low-work function metal and metal compounds comprised of Li or Na are not effective for use in the present invention. This was unexpected because these materials are notoriously effective for other cathode materials such as aluminum. It is postulated that their relatively small size leads to unwanted diffusion into the organic layer so that there are not enough nucleation sites available at the surface when depositing the Mg.

The thickness of the adhesion-promoting layer is very critical. The range of thickness found to be useful is between 0.01 and 3 nm and, more preferably, between 0.05 and 2 nm. Surprisingly, an adhesion-promoting layer with a thickness as thin as less than a monolayer coverage deposited on ETL 111 is sufficient to provide the desired nucleation sites for the film formation of Mg cathode. If a higher work function (>3.7 eV) material is used for the adhesion-promoting layer, the electron injection ability should be provided by the low-work function Mg cathode (or other low-work function metal cathode). In this case, a portion of the organic layer surface should be directly in contact with the Mg layer. The higher work function adhesion-promoting layer, therefore, should be sufficiently thin as not to form a fully covered layer on the organic layer.

If a low-work function material is used for the adhesion-promoting layer, the electron injection ability could be determined by the low-work function metal itself, and therefore, the thickness of the adhesion-promoting layer can be considerably thicker than one or two monolayers. However, because low-work function metals, especially alkali metals, are extremely reactive to moisture and oxygen, the use of a thick layer of these materials may be undesirable as they are susceptible to corrosion (oxidation) in the presence of adventitious water or oxygen. This results in the formation of an electrically insulating layer and a barrier for electron injection from the cathode to the EL medium. The desired range of thickness between 0.01 and 3 nm is to ensure that the electron injection ability of the cathode constructed with the adhesion-promoting layer is not compromised. That is, the electron injection ability should be no less than that of the Mg cathode.

The present invention can be employed in most OLED device configurations. These include very simple structures comprising a single anode and cathode to more complex devices, such as passive matrix displays comprised of orthogonal arrays of anodes and cathodes to form pixels, and active-matrix displays where each pixel is controlled independently, for example, with a thin film transistor (TFT).

There are numerous configurations of the organic layers wherein the present invention can be successfully practiced. As mentioned previously, a typical structure is shown in FIG. 2. Note that the substrate may alternatively be located adjacent to the cathode, or the substrate may actually constitute the anode. Also, the total combined thickness of the organic layers is preferably less than 500 nm.

The substrate 101 can either be light transmissive or opaque, depending on the intended direction of light emission. The light transmissive property is desirable for viewing the EL emission through the substrate. Transparent glass or plastic are commonly employed in such cases. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, ceramics, and circuit board materials. Of course, it is necessary to provide in these device configurations a light-transparent top electrode.

The conductive anode layer 103 is commonly formed over the substrate and, when EL emission is viewed through the anode, should be transparent or substantially transparent to the emission of interest. Common transparent anode materials used in the present invention are indium-tin oxide (ITO) and tin oxide, but other metal oxides can work including, but not limited to, aluminum- or indium-doped zinc oxide (IZO), magnesium-indium oxide, and nickel-tungsten oxide. In addition to these oxides, metal nitrides, such as gallium nitride, and metal selenides, such as zinc selenide, and metal sulfides, such as zinc sulfide, can be used in layer 103. For applications where EL emission is viewed through the top electrode, the transmissive characteristics of layer 103 are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well known photolithographic processes.

While not always necessary, it is often useful that a hole-injecting layer 105 be provided between anode 103 and hole-transporting layer 107. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, and plasma-deposited fluorocarbon polymers as described in U.S. Pat. No. 6,208,075. Alternative hole-injecting materials reportedly useful in organic EL devices are described in EP 0 891 121 A1 and EP 1 029 909 A1.

The hole-transporting layer 107 of the organic EL device contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al. U.S. Pat. No. 3,567,450 and U.S. Pat. No. 3,658,520.

A more preferred class of aromatic tertiary amines are those which include at least two aromatic tertiary amine moieties as described in U.S. Pat. Nos. 4,720,432 and 5,061,569. Such compounds include those represented by structural formula (A).

A wherein:

$Q_1$ and $Q_2$ are independently selected aromatic tertiary amine moieties; and G is a linking group such as an arylene, cycloalkylene, or alkylene group of a carbon to carbon bond.

In one embodiment, at least one of $Q_1$ or $Q_2$ contains a polycyclic fused ring structure, e.g., a naphthalene. When G is an aryl group, it is conveniently a phenylene, biphenylene, or naphthalene moiety.

A useful class of triarylamines satisfying structural formula (A) and containing two triarylamine moieties is represented by structural formula (B):

wherein:

R₁ and R₂ each independently represents a hydrogen atom, an aryl group, or an alkyl group or R₁ and R₂ together represent the atoms completing a cycloalkyl group; and R₃ and R₄ each independently represents an aryl group, which is in turn substituted with a diaryl substituted amino group, as indicated by structural formula (C):

wherein R₅ and R₆ are independently selected aryl groups. In one embodiment, at least one of R₅ or R₆ contains a polycyclic fused ring structure, e.g., a naphthalene.

Another class of aromatic tertiary amines are the tetraaryldiamines. Desirable tetraaryldiamines include two diarylamino groups, such as indicated by formula (C), linked through an arylene group. Useful tetraaryldiamines include those represented by formula (D):

wherein:

each Are is an independently selected arylene group, such as a phenylene or anthracene moiety;

n is an integer of from 1 to 4; and

Ar, R₇, R₈, and R₉ are independently selected aryl groups. In a typical embodiment, at least one of Ar, R₇, R₈, and R₉ is a polycyclic fused ring structure, e.g., a naphthalene.

The various alkyl, alkylene, aryl, and arylene moieties of the foregoing structural formulae (A), (B), (C), (D), can each in turn be substituted. Typical substituents include alkyl groups, alkoxy groups, aryl groups, aryloxy groups, and halogen such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms—e.g., cyclopentyl, cyclohexyl, and cycloheptyl ring structures. The aryl and arylene moieties are usually phenyl and phenylene moieties.

The hole-transporting layer can be formed of a single or a mixture of aromatic tertiary amine compounds. Specifically, one may employ a triarylamine, such as a triarylamine satisfying the formula (B), in combination with a tetraaryldiamine, such as indicated by formula (D). When a triarylamine is employed in combination with a tetraaryldiamine, the latter is positioned as a layer interposed between the triarylamine and the electron injecting and transporting layer. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl
4,4'-Bis[N-(1-naphthyl)-N-(2-naphthyl)amino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis{N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene

Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

As more fully described in U.S. Pat. Nos. 4,769,292 and 5,935,721, the light-emitting layer (LEL) 109 of the organic EL element comprises a luminescent or fluorescent material where electroluminescence is produced as a result of electron-hole pair recombination in this region. The light-emitting layer can be comprised of a single material, but more commonly consists of a host material doped with a guest compound or compounds where light emission comes primarily from the dopant and can be of any color. The host materials in the light-emitting layer can be an electron-transporting material, as defined below, a hole-transporting material, as defined above, or another material or combination of materials that support hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material.

An important relationship for choosing a dye as a dopant is a comparison of the bandgap potential which is defined as the energy difference between the highest occupied molecular orbital and the lowest unoccupied molecular orbital of the molecule. For efficient energy transfer from the host to the dopant molecule, a necessary condition is that the band gap of the dopant is smaller than that of the host material.

Host and emitting molecules known to be of use include, but are not limited to, those disclosed in U.S. Pat. Nos. 4,768,292; 5,141,671; 5,150,006; 5,151,629; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline and similar derivatives (Formula E) constitute one class of useful host compounds capable of supporting electroluminescence, and are particularly suitable for light emission of wavelengths longer than 500 nm, e.g., green, yellow, orange, and red.

E wherein:

M represents a metal;

n is an integer of from 1 to 4; and

Z independently in each occurrence represents the atoms completing a nucleus having at least two fused aromatic rings.

From the foregoing it is apparent that the metal can be monovalent, divalent, trivalent, or tetravalent metal. The metal can, for example, be an alkali metal, such as lithium, sodium, or potassium; an alkaline earth metal, such as magnesium or calcium; an earth metal, such aluminum or gallium, or a transition metal such as zinc or zirconium. Generally any monovalent, divalent, trivalent, or tetravalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:

CO-1: Aluminum trisoxine [alias, tris(8-quinolinolato) aluminum(III) or Alq]

CO-2: Magnesium bisoxine [alias, bis(8-quinolinolato) magnesium(II)]

CO-3: Bis[benzo{f}-8-quinolinolato]zinc (II)

CO-4: Bis(2-methyl-8-quinolinolato)aluminum(III)-μ-oxo-bis(2-methyl-8-quinolinolato) aluminum(III)

CO-5: Indium trisoxine [alias, tris(8-quinolinolato)indium]

CO-6: Aluminum tris(5-methyloxine) [alias, tris(5-methyl-8-quinolinolato) aluminum(III)]

CO-7: Lithium oxine [alias, (8-quinolinolato)lithium(I)]

CO-8: Gallium oxine [alias, tris(8-quinolinolato)gallium (III)]

CO-9: Zirconium oxine [alias, tetra(8-quinolinolato) zirconium(IV)]

Derivatives of 9,10-di-(2-naphthyl)anthracene (Formula F) constitute one class of useful hosts capable of supporting electroluminescence, and are particularly suitable for light emission of wavelengths longer than 400 nm, e.g., blue, green, yellow, orange, or red.

F wherein:

$R^1$, $R^2$, $R^3$, $R^4$, $R^5$, and $R^6$ represent one or more substituents on each ring where each substituent is individually selected from the following groups:

Group 1: hydrogen, or alkyl of from 1 to 24 carbon atoms;

Group 2: aryl or substituted aryl of from 5 to 20 carbon atoms;

Group 3: carbon atoms from 4 to 24 necessary to complete a fused aromatic ring of anthracenyl; pyrenyl, or perylenyl;

Group 4: heteroaryl or substituted heteroaryl of from 5 to 24 carbon atoms as necessary to complete a fused heteroaromatic ring of furyl, thienyl, pyridyl, quinolinyl or other heterocyclic systems;

Group 5: alkoxylamino, alkylamino, or arylamino of from 1 to 24 carbon atoms; and Group 6: fluorine, chlorine, bromine or cyano.

Illustrative examples include 9,10-di-(2-naphthyl) anthracene and 2-t-butyl-9,10-di-(2-naphthyl)anthracene. Other anthracene derivatives can be useful as a host in the LEL, including derivatives of 9,10-bis[4-(2,2-diphenylethenyl)phenyl]anthracene.

Benzazole derivatives (formula G) constitute another class of useful hosts capable of supporting electroluminescence, and are particularly suitable for light emission of wavelengths longer than 400 nm, e.g., blue, green, yellow, orange, or red.

G wherein:

n is an integer of 3 to 8;

Z is O, NR or S;

R' represents individually hydrogen; alkyl of from 1 to 24 carbon atoms, for example, propyl, t-butyl, heptyl, and the like; aryl or hetero-atom substituted aryl of from 5 to 20 carbon atoms for example phenyl and naphthyl, furyl, thienyl, pyridyl, quinolinyl and other heterocyclic systems; or halo such as chloro, fluoro; or atoms necessary to complete a fused aromatic ring; and

L is a linkage unit consisting of alkyl, aryl, substituted alkyl, or substituted aryl, which conjugately or unconjugately connects the multiple benzazoles together.

An example of a useful benzazole is 2,2',2"-(1,3,5-phenylene)tris[1-phenyl-1H-benzimidazole].

Desirable fluorescent dopants include derivatives of anthracene, tetracene, xanthene, perylene, rubrene, coumarin, rhodamine, quinacridone, dicyanomethylenepyran compounds, thiopyran compounds, polymethine compounds, pyrilium and thiapyrilium compounds, and carbostyryl compounds. Illustrative examples of useful dopants include, but are not limited to, the following:

L1

L2

L3

L4

L5

L6

L7

L8

|     | X | R1     | R2     |
|-----|---|--------|--------|
| L9  | O | H      | H      |
| L10 | O | H      | Methyl |
| L11 | O | Methyl | H      |
| L12 | O | Methyl | Methyl |
| L13 | O | H      | t-butyl |
| L14 | O | t-butyl | H     |
| L15 | O | t-butyl | t-butyl |
| L16 | S | H      | H      |
| L17 | S | H      | Methyl |
| L18 | S | Methyl | H      |
| L19 | S | Methyl | Methyl |
| L20 | S | H      | t-butyl |
| L21 | S | t-butyl | H     |
| L22 | S | t-butyl | t-butyl |

| | X | R1 | R2 |
|---|---|---|---|
| L23 | O | H | H |
| L24 | O | H | Methyl |
| L25 | O | Methyl | H |
| L26 | O | Methyl | Methyl |
| L27 | O | H | t-butyl |
| L28 | O | t-butyl | H |
| L29 | O | t-butyl | t-butyl |
| L30 | S | H | H |
| L31 | S | H | Methyl |
| L32 | S | Methyl | H |
| L33 | S | Methyl | Methyl |
| L34 | S | H | t-butyl |
| L35 | S | t-butyl | H |
| L36 | S | t-butyl | t-butyl |

| | R |
|---|---|
| L37 | phenyl |
| L38 | methyl |
| L39 | t-butyl |
| L40 | mesityl |

| | R |
|---|---|
| L41 | phenyl |
| L42 | methyl |
| L43 | t-butyl |
| L44 | mesityl |

L45

L46

L47

L48

Preferred thin film-forming materials for use in forming the electron-transporting layer 111 of the organic EL devices of the present invention are metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural formula (E), previously described.

Other electron-transporting materials include various butadiene derivatives as disclosed in U.S. Pat. No. 4,356,429 and various heterocyclic optical brighteners as described in U.S. Pat. No. 4,539,507. Benzazoles satisfying structural formula (G) are also useful electron transporting materials.

In some instances, layers 109 and 111 can optionally be collapsed into a single layer that serves the function of supporting both light emission and electron transportation. In addition, polymeric materials may constitute the host in the LEL or serve as the ETL or both. Such polymers include poly(p-phenylenevinylene) (PPV), PPV derivatives, polyfluorene and polyfluorene derivatives.

The cathode of the present invention has been described in detail. When light emission is through the anode, the cathode layer 240 can be of any useful thickness. When light emission is viewed through the cathode, the cathode must be transparent or nearly transparent. For such applications, the Mg cathode layer must be thin, preferably less than 25 nm thick. In such cases, an optically transparent secondary cathode such as ITO may optionally be provided over the thin Mg cathode to lower overall sheet resistance. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

The organic materials mentioned above are suitably deposited through sublimation, but can be deposited from a solvent with an optional binder to improve film formation. If the material is a polymer, solvent deposition is usually preferred. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. No. 5,851,709 and U.S. Pat. No. 6,066,357) and inkjet method (U.S. Pat. No. 6,066,357).

Most OLED devices are sensitive to moisture and/or oxygen so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890.

The entire contents of the patents and other publications referred to in this specification are incorporated herein by reference.

EXAMPLES

The following examples are presented for a further understanding of the present invention. For purposes of brevity, the materials and layers formed therefrom will be abbreviated as given below.

ITO: indium-tin-oxide; used in forming transparent anode 103 on glass substrates CFx: polymerized fluorocarbon layer; used in forming hole-injecting layer 121, 221 in electroluminescent medium NPB: 4,4'-bis(1-naphthyl-N-phenylamino)biphenyl; used in forming the hole-transporting layer 107 in electroluminescent medium Alq: tris(8-hydroxyquinoline)aluminum(III); used in forming both the light-emitting layer 109 and electron-transporting layer 111 in electroluminescent medium Mg:Ag: magnesium:silver at a ratio of 10:1 by volume; used in forming the cathode 113

Mg: substantially pure magnesium; used in forming the cathode 113 or 240.

The EL characteristics of all the fabricated devices were evaluated using a constant current source and a photometer. The luminance efficiency and the driving voltage were measured at a current density of 20 mA/cm$^2$. Electroluminescence images of some devices were taken by a CCD camera. Some devices were subjected to stability tests, operated under 20 mA/cm$^2$ at room temperature.

Example 1 (Comparative)

No Adhesion-Promoting Layer/Conventional Mg:Ag Alloy

The preparation of a reference OLED with a Mg:Ag alloy cathode (see FIG. 1) is as follows: A glass substrate coated with a transparent ITO conductive layer was cleaned and dried using a commercial glass scrubber tool. The ITO surface was subsequently treated with oxidative plasma to condition the surface as an anode. A layer of CFx, 1 nm thick, was deposited on the clean ITO surface by decomposing CHF$_3$ gas in RF plasma treatment chamber. The substrate was then transferred into another chamber for the other layer deposition. The following layers were deposited in the following sequence by sublimation from a heated boat in the conventional vacuum deposition chamber under a vacuum of approximately 10$^{-6}$ Torr:

(1) a hole-transporting layer, 75 nm thick, consisting of NPB;

(2) a light-emitting layer and electron-injecting layer (both layers are collapsed into one layer), 60 nm thick, consisting of Alq;

(3) a cathode, approximately 200 nm thick, consisting of Mg:Ag.

After the deposition of the layers, the fabricated device was taken out from the deposition chamber and transferred from ambient into a dry box for encapsulation. The device structure is denoted as ITO/CFx/NPB/Alq/Mg:Ag.

Figure 5:
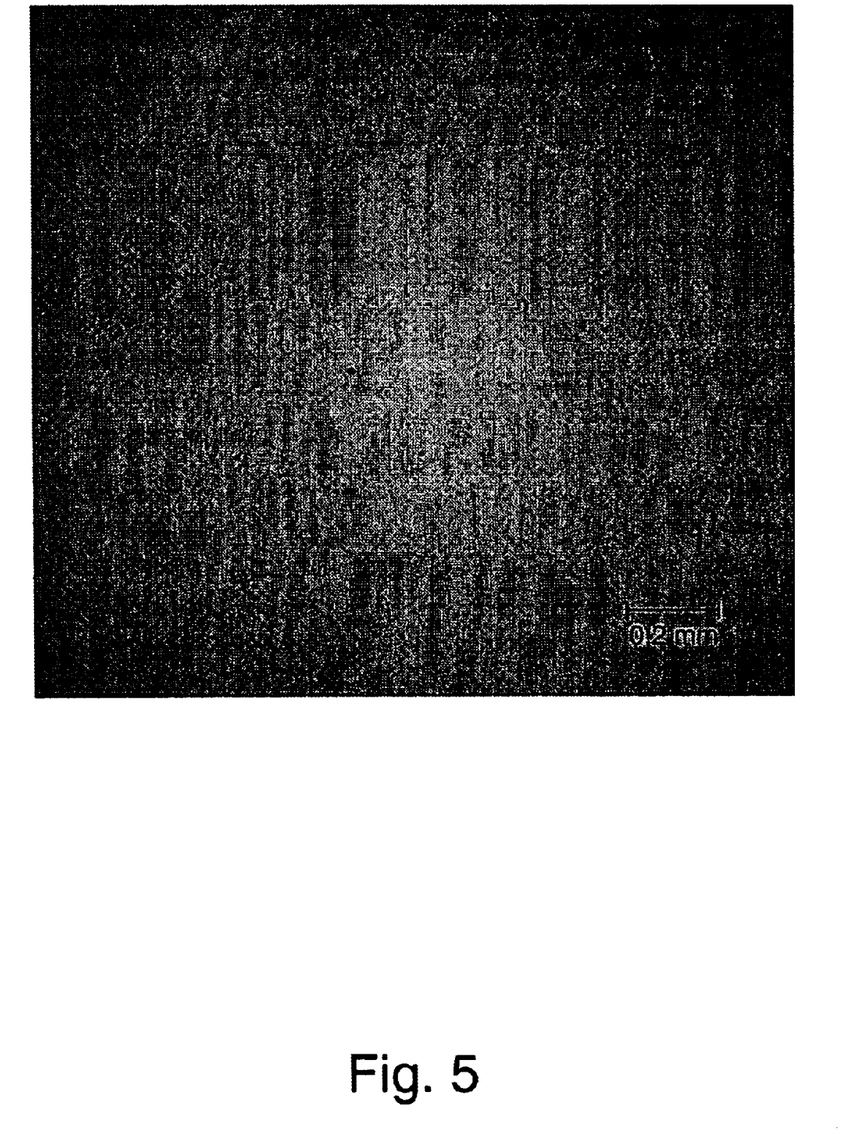
FIG. 5 depicts a reference electroluminescent image produced by an OLED having an evaporated Mg:Ag cathode with no adhesion-promoting layer.
Figure 6:
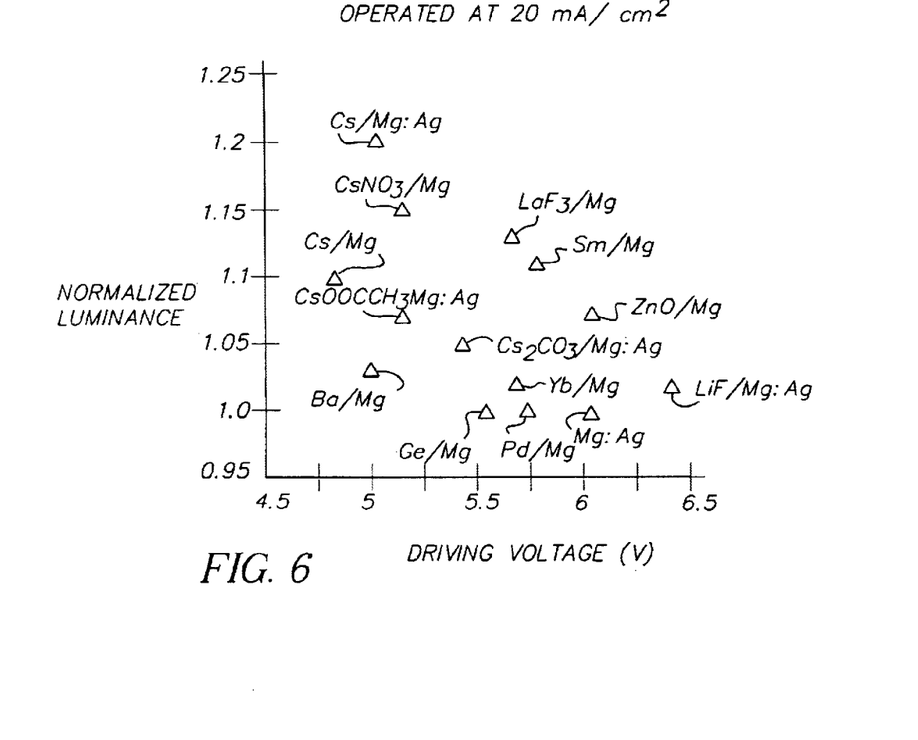
FIG. 6 depicts an electroluminescent characteristics of the devices using adhesion-promoting layer.

The device typically has a driving voltage of 6.0 V to pass 20 mA/cm$^2$ and an EL efficiency of 3.2 cd/A. In FIG. 6, which shows the driving voltage and the normalized luminance values for OLEDs constructed in the present invention, the normalized luminance of this reference OLED is 1.0. The electroluminescence image of the device is shown in FIG. 5.

In the following examples the adhesion-promoting layer and cathode are separated by a slash in the format: adhesion-promoting layer/cathode.

Example 2 (Comparative)

No Adhesion-Promoting Layer/Mg Cathode

Figure 3:
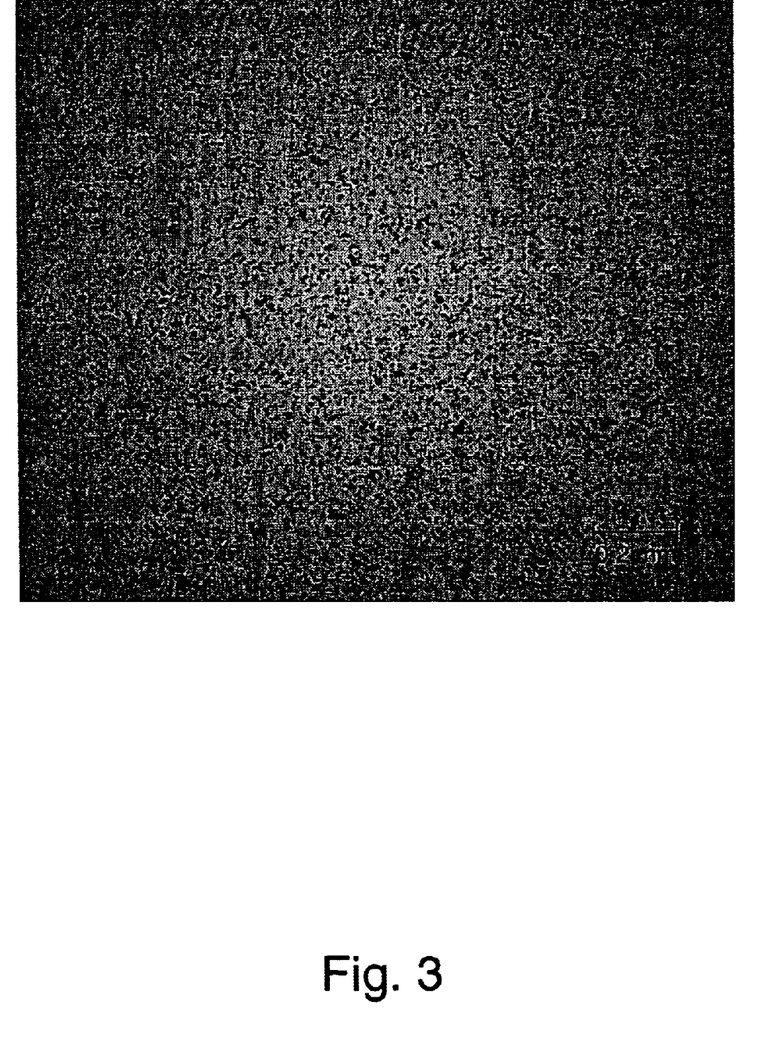
FIG. 3 depicts an electroluminescent image produced by an OLED having an evaporated Mg cathode but without the adhesion-promoting layer.

OLEDs similar to that of Comparative Example 1 were prepared, except that the cathode was >99.9% pure Mg. The contact between the ETL and the Mg cathode is very poor. The electroluminescence image of the device is shown in FIG. 3. The voltage was too high and electroluminescence too low to be plotted in FIG. 6.

Example 3 (Inventive)

Cs/Mg Cathode

An OLED similar to that of Comparative Example 2 was prepared, except that an adhesion-promoting layer was deposited on the top of electron-transporting layer prior to the Mg cathode deposition. Example 3 utilized 0.1 nm thick Cs metal as the adhesion-promoting layer. The device structure is denoted as ITO/CFx/NPB/Alq/Cs/Mg. This device has 10% higher luminance efficiency and 1.2 V lower driving voltage than those of the comparative reference device (Example 1). These values are shown in FIG. 6, and the electroluminescence image of the device is shown in FIG. 4.

Figure 4:
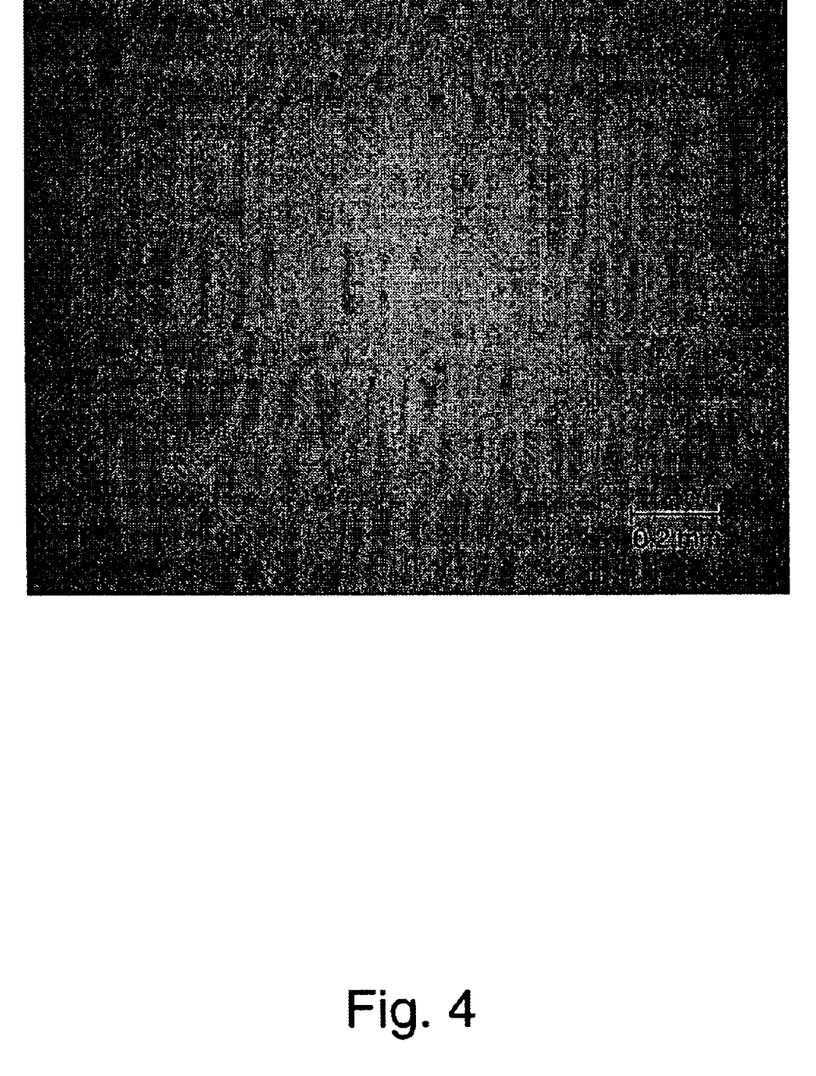
FIG. 4 depicts an electroluminescent image produced by an OLED having an evaporated Mg cathode and with an adhesion-promoting layer according to the present invention.

The advantage of the adhesion-promoting layer can be appreciated by comparing the electroluminescence images of the devices in FIGS. 3, 4, and 5. FIG. 3 shows the electroluminescence image of an OLED with an evaporated Mg cathode (220 nm thick) but without an adhesion-promoting layer; FIG. 4 shows the electroluminescence image of an OLED with an evaporated Mg cathode (also 220 nm) and an adhesion-promoting layer (0.1 nm Cs layer); and FIG. 5 shows the electroluminescence image of an OLED with a thermally evaporated Mg:Ag alloy cathode (220 nm). These three devices have otherwise an identical EL medium and an ITO anode. It is clear from FIG. 3 that the OLED constructed without an adhesion-promoting layer produces many dark spots (non-emissive areas) when the device is energized. These dark spots are caused by poor electron injection in localized areas as a result of a poor contact between Mg cathode and organic layer. The evenly distributed dark spots indicate that during the early nucleation stage of Mg deposition, Mg atoms form separated microcrystals due to the shortage of nucleation sites on the organic surface and these separated microcrystals leave numerous non-contact micro-areas before they joint to form a Mg film. The dark spot density is dramatically reduced, as shown in FIG. 4, in the OLED constructed with a 0.1 nm thick Cs layer deposited on the organic layer before the Mg deposition, due to the improved contact between Mg and the organic layer provided by the adhesion-promoting layer. Comparing FIGS. 4 and 5, it can be seen that the dark spot density of the OLED with the Cs/Mg cathode is similar to or less than that of the OLED with Mg:Ag alloy cathode. The use of an alloy composition, such as Mg:Ag, is well known to produce an excellent contact between the organic layer and the cathode. It is clear that for substantially pure Mg to be useful as the cathode, an adhesion-promoting layer is needed to provide for a good contact between metal cathode and the organic layer.

Figure 7:
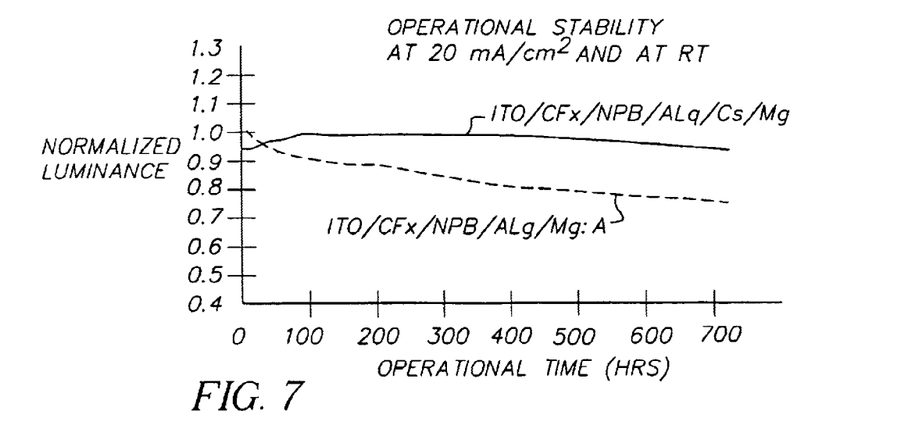
FIG. 7 compares the operational stability between a prior art OLED with Mg:Ag cathode and an OLED with Cs adhesion-promoting layer and Mg cathode in the present invention.

In addition to the clear luminance efficiency and driving voltage advantages, the adhesion-promoting layer has better operational stability than the device with Mg:Ag cathode. FIG. 7 compares the operational stability between Example 3 and Example 1 under 20 mA/cm$^2$ and at the room temperature. The luminance of the OLED with Mg:Ag cathode dropped 10% at 100 hours operation, but that of the OLED with Cs/Mg cathode dropped only about 5% at 700 hours of operation.

Example 4 (Comparative)

Li/Mg Cathode

Example 4 was similar to Example 3 except that it utilized a 0.2 nm thick Li metal as an adhesion-promoting layer in place of Cs. Even under a very high driving voltage of 12.4 V, the photometer could not detect any electroluminescence. Therefore, it could not be plotted in FIG. 6.

Example 5 (Inventive)

CsNO$_3$/Mg Cathode

Example 5 was similar to Example 3 except that it utilized 0.5 nm thick CsNO$_3$ as an adhesion-promoting layer. This device has 15% higher luminance efficiency and 0.9 V lower driving voltage than those of the reference device. Their values are shown in FIG. 6.

Example 6 (Comparative)

LiF/Mg Cathode

Example 6 was similar to Example 3 except that it utilized a 0.5 nm thick LiF as an adhesion-promoting layer. This device has very poor contact between electron-transporting layer and Mg cathode. Its electroluminescence image is quite similar to FIG. 3 of Example 2. The voltage was too high and electroluminescence too low to be plotted in FIG. 6.

Both examples 4 and 6 clearly show that an adhesion-promoting layer comprising Li or LiF yield inadequate the performance of the device with Mg cathode. This was unexpected in view of the prior art where these materials are shown to be useful. When the adhesion-promoting layer is comprised of Cs or CsNO$_3$, the device performance is greatly improved. As previously mentioned, it is postulated that the relatively small size of Li or ionic Li in LiF results in rapid diffusion into the organic layer. Thus, there are not enough Li atoms at the surface to aid nucleation of the Mg cathode. Cs, by contrast, is much larger and does not diffuse as readily. While this diffusion does not appear to be a problem for cathodes not requiring an adhesion layer (for example, Al), this surface adhesion-promoting property is vital for Mg cathodes. Clearly, then, the electron-injecting layer materials useful for cathodes such as aluminum are not necessarily useful as adhesion-promoting layers for Mg cathodes.

Example 7 (Inventive)

Alkaline Earth Metal/Mg Cathode

Example 7 was similar to Example 3 except that it utilized 0.5 nm thick Ba metal as an adhesion-promoting layer. This device has about 3% higher luminance efficiency and 1.0 V lower driving voltage than those of the reference device. Their values are shown in FIG. 6.

Examples 8–9 (Inventive)

Rare Earth Metal/Mg Cathode

Example 8 was similar to Example 3 except that it utilized 3.0 nm thick Yb metal as an adhesion-promoting layer. This device has similar luminance efficiency to that of the reference device and about 0.4 V lower driving voltage than that of the reference device. Their values are shown in FIG. 6. Example 10 was similar to Example 3 except that it utilized 0.2 nm thick Sm metal as an adhesion-promoting layer. This device has about 11% higher luminance efficiency than that of the reference device and has similar driving voltage to that of the reference device. Their values are shown in FIG. 6.

Example 10 (Inventive)

Rare Earth Metal Compound/Mg Cathode

Example 10 was similar to Example 3 except that it utilized 0.5 nm thick LaF$_3$ as an adhesion-promoting layer.

This device has about 13% higher luminance efficiency and about 0.4 V lower driving voltage than those of the reference device. Their values are shown in FIG. 6.

Example 11 (Inventive)

High Work Function Material/Mg Cathode

Example 11 was similar to Example 3 except that it utilized 0.2 nm thick Ge as an adhesion-promoting layer by electron beam evaporation. This device has similar luminance efficiency to that of the reference device and about 0.4 V lower driving voltage than that of the reference device. Their values are shown in FIG. 6.

Example 12 (Inventive)

Transition Metal/Mg Cathode

Example 12 was similar to Example 3 except that it utilized 0.2 nm thick Pd metal as an adhesion-promoting layer, formed by electron beam evaporation. This device has similar luminance efficiency to that of the reference device and about 0.3 V lower driving voltage than that of the reference device. Their values are shown in FIG. 6.

Example 13 (Inventive)

Transition Metal Compound/Mg Cathode

Example 13 utilized a 0.2 nm thick ZnO as an adhesion-promoting layer by electron beam evaporation. This device has about 7% higher luminance efficiency than that of the reference device and has similar driving voltage to that of the reference device. Their values are shown in FIG. 6.

Examples 14–16 (Inventive)

Alkali Metal or Alkali Metal Compound/Mg:Ag Cathode

OLED devices similar to that of Comparative Example 1 were prepared, except that an adhesion-promoting layer was deposited on the top of electron-transporting layer and before the deposition of the Mg:Ag cathode. Example 14 utilized a 0.5 nm thick Cs metal as an adhesion-promoting layer. This device has 20% higher luminance efficiency and 1.0 V lower driving voltage than those of the reference device. Their values are shown in FIG. 6. Example 15 utilized 0.5 nm thick cesium acetate (CsOOCCH$_3$) as an adhesion-promoting layer. This device has about 7% higher luminance efficiency and about 0.9 V lower driving voltage than those of the reference device. Their values are shown in FIG. 6. Example 16 utilized a 0.3 nm thick cesium carbonate (Cs$_2$CO$_3$) as an adhesion-promoting layer. This device has about 5% higher luminance efficiency and about 0.6 V lower driving voltage than those of the reference device. Their values are shown in FIG. 6.

Example 17 (Comparison)

LiF/Mg:Ag Cathode

Example 17 was similar to Example 14 except that it utilized 0.5 nm thick LiF in place of Cs an adhesion-promoting layer. This device has similar luminance efficiency to that of the reference device (Example 1), but the driving voltage was disadvantaged in that it was 0.4 V higher. Their values are shown in FIG. 6.

Examples 14–16 show that the electroluminescence characteristics of the OLED devices using a 91% pure Mg cathode can also be improved by using the adhesion-promoting layer of the present invention. Example 17 illustrates the fact that LiF, a commonly used electron injection layer that works well for Al cathodes, does not provide significant advantages for the Mg-based cathodes. As mentioned previously, it is believed that thin layers of these smaller metals or metal compounds diffuse too readily into the organic layer. Thus, there are not enough nucleation centers at the surface to aid cathode film formation and improve adhesion.

The invention has been described in detail with particular reference to certain preferred embodiments thereof, but it will be understood that variations and modifications can be effected within the spirit and scope of the invention.

| PARTS LIST | |
|---|---|
| 100 | organic electroluminescent device (PRIOR ART) |
| 101 | substrate |
| 103 | anode |
| 105 | hole-injecting layer (HIL) |
| 107 | hole-transporting layer (HTL) |
| 109 | light-emitting layer (LEL) |
| 111 | electron-transporting layer (ETL) |
| 113 | cathode |
| 150 | electrical conductors |
| 160 | voltage/current source |
| 200 | organic electroluminescent device with an adhesion-promoting layer |
| 230 | adhesion-promoting layer |
| 240 | substantially pure Mg cathode |

What is claimed is:

1. An organic electroluminescent device comprising:
    a) an anode and a cathode;
    b) an electroluminescent medium disposed between the anode and the cathode;
    c) an adhesion-promoting layer in contact with the cathode and the electroluminescent medium;
    d) the adhesion-promoting layer includes one or more alkaline earth metals selected from Ca, Sr or Ba; and
    e) the cathode is substantially pure magnesium.

2. The organic electroluminescent device of claim 1 wherein the cathode is greater than 99% pure Mg.

3. The organic electroluminescent device of claim 1 wherein the cathode is greater than 99.9% pure Mg.

4. The organic electroluminescent device of claim 1 wherein the electroluminescent medium disposed between the anode and the cathode includes a layer comprising Alq that is adjacent to the adhesion-promoting layer.

5. The organic electroluminescent device of claim 1 wherein the adhesion-promoting layer has a thickness between 0.01 nm and 3.0 nm.

6. The organic electroluminescent device of claim 5 wherein the adhesion-promoting layer has a thickness between 0.05 nm and 2.0 nm.

7. An organic electroluminescent device comprising:
    a) an anode;
    b) a cathode, wherein the cathode is substantially pure magnesium;
    c) an electroluminescent medium disposed between the anode and the cathode; and
    d) an adhesion-promoting layer in contact with the cathode and the electroluminescent medium and comprising at least one rare earth metal compound.

8. The organic electroluminescent device of claim 7 wherein the at least one rare-earth metal compound includes at least one oxide of La, Ce, Sm, Eu, Th, Dy, and Yb.

9. An organic electroluminescent device comprising:
a) an anode and a cathode;
b) an electroluminescent medium disposed between the anode and the cathode;
c) an adhesion-promoting layer in contact with the cathode and the electroluminescent medium;
d) the adhesion-promoting layer includes one or more transition metals; and
e) the cathode is substantially pure magnesium.

10. An organic electroluminescent device comprising:
a) an anode and a cathode;
b) an electroluminescent medium disposed between the anode and the cathode;
c) an adhesion-promoting layer in contact with the cathode and the electroluminescent medium;
d) the adhesion-promoting layer includes at least one of Sb, Ge, Sn, Pb, Ga, Zn, Ni, Pd, Pt, Rh, Ir, Fe Mn or Nb; and
e) the cathode is substantially pure magnesium.

11. An organic electroluminescent device comprising:
a) an anode and a cathode;
b) an electroluminescent medium disposed between the anode and the cathode;
c) an adhesion-promoting layer in contact with the cathode and the electroluminescent medium;
d) the adhesion-promoting layer includes one or more rare earth metals; and
e) the cathode is substantially pure magnesium.

12. The organic electroluminescent device of claim 11 wherein the rare-earth metal includes La, Ce, Sm, Eu, Tb, Dy, or Yb.

* * * * *